(12) United States Patent
Ito

(10) Patent No.: US 9,910,096 B2
(45) Date of Patent: Mar. 6, 2018

(54) CONTROL APPARATUS

(71) Applicant: DENSO CORPORATION, Kariya, Aichi-pref. (JP)

(72) Inventor: Akira Ito, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 302 days.

(21) Appl. No.: 14/933,074

(22) Filed: Nov. 5, 2015

(65) Prior Publication Data

US 2016/0139572 A1 May 19, 2016

(30) Foreign Application Priority Data

Nov. 14, 2014 (JP) ................................. 2014-231272

(51) Int. Cl.
| | | |
|---|---|---|
| *G01R 31/36* | (2006.01) | |
| *G05B 11/42* | (2006.01) | |
| *G01R 35/00* | (2006.01) | |
| *G01R 21/133* | (2006.01) | |
| *G01R 21/06* | (2006.01) | |

(52) U.S. Cl.
CPC ....... *G01R 31/3624* (2013.01); *G01R 21/133* (2013.01); *G01R 35/00* (2013.01); *G05B 11/42* (2013.01); *G01R 21/06* (2013.01)

(58) Field of Classification Search
CPC ..... G05B 11/42; G01R 21/06; G01R 31/3624
USPC ........................................................ 700/11
See application file for complete search history.

(56) References Cited

U.S. PATENT DOCUMENTS

| | | | |
|---|---|---|---|
| 7,714,543 B2* | 5/2010 | Yoshida | B60L 3/0038 320/134 |
| 2006/0015231 A1 | 1/2006 | Yoshimura et al. | |
| 2010/0030421 A1 | 2/2010 | Yoshimura et al. | |
| 2011/0022290 A1* | 1/2011 | Kaneko | F02D 41/222 701/103 |
| 2013/0226474 A1* | 8/2013 | Adler | G01L 27/00 702/50 |
| 2014/0188343 A1 | 7/2014 | Yoshimura et al. | |
| 2014/0247014 A1* | 9/2014 | Nishikawa | H01M 10/44 320/126 |
| 2015/0100207 A1 | 4/2015 | Yoshimura et al. | |
| 2015/0316636 A1* | 11/2015 | Nishijima | G01R 31/3624 702/58 |

FOREIGN PATENT DOCUMENTS

JP   2009-227276 A   10/2009

* cited by examiner

*Primary Examiner* — Chun Cao
(74) *Attorney, Agent, or Firm* — Harness, Dickey & Pierce, P.L.C.

(57) ABSTRACT

A control apparatus includes: a tentative target calculator that calculates a tentative target value for a first physical quantity, based on a control target value; a correction calculator that calculates a correction value; and a first target value calculator that calculates as a first target value by adding the correction value to the tentative target value. When a second sensor fails, the first target value calculator designates the tentative target value as the first target value without adding the correction value to the tentative target value. The control apparatus further includes a variation inhibitor that inhibits the designated first target value from greatly varying due to the failure in the second sensor.

3 Claims, 2 Drawing Sheets

CONTROL APPARATUS

CROSS REFERENCE TO RELATED APPLICATION

The present application is based on Japanese Patent Application No. 2014-231272 filed on Nov. 14, 2014, the disclosure of which is incorporated herein by reference.

TECHNICAL FIELD

The present disclosure relates to a control apparatus that performs control of matching a physical quantity, which is an object of control, with a designated target value.

BACKGROUND ART

Patent Literature 1: JP 2009-227276 A

A control apparatus that performs control of matching a specific physical quantity with a target value is widely used in various technological fields. This type of control apparatus performs control of matching a physical quantity (hereinafter, may be referred to as a control physical quantity), which is an object of control, with a target value while feeding back a measured value or measured values obtained by a sole sensor or a plurality of sensors.

A physical quantity measured by a sensor and fed back may be a control physical quantity or may be a physical quantity other than the control physical quantity. For example, the control of matching a vehicle speed of an automobile with a target value may feed back a vehicle speed (control physical quantity) measured by a speed sensor. Alternatively, a physical quantity relevant to the vehicle speed, such as an accelerator pedal depression quantity or the number of revolutions of an engine, may be fed back in place of or together with the vehicle speed.

A sensor, which measures a physical quantity, may fail and output an abnormal value to be fed back, preventing normal control. This may involve, of a controlled apparatus (e.g., automobile), an abnormal operation undesirable in safety.

Thus, a system is provided to include a plurality of sensors each measuring one physical quantity, to attain redundancy and perform normal control continuously even after part of the sensors fails. Such redundancy has been achieved based on various schemes.

Patent Literature 1 discloses a vehicle control apparatus having a plurality of controllers that are interconnected over a network. If a sensor included in part of the controllers fails, measured values of sensors included in the other controllers are obtained over the network and used for control.

SUMMARY

The number of sensors employed in control recently gets larger for more sophisticated and complex control than existing one having often been adopted. In such a complex control system, each of all the sensors may include redundant sensors to sustain normal control even after part of the sensors fails. However, since the sum total of sensors becomes enormous and required cost increases too greatly, providing each of all the sensors with redundant sensors may be unpractical.

An object of the present disclosure is to provide a control apparatus capable of sustaining normal control even if a sensor that does not include redundant sensors fails.

To achieve the above object, according to an example of the present disclosure, a control apparatus is provided to perform control of matching a control physical quantity, which is an object of control, with a designated control target value. The control apparatus includes a first sensor that measures a first physical quantity; a second sensor that measures a second physical quantity; a target designator that designates a first target value, which is a target value for the first physical quantity, to match the control physical quantity with the control target value; and a main controller that performs control of matching the first physical quantity with the first target value. Herein, the target designator includes a tentative target calculator, a correction calculator, a first target value calculator, a failure discriminator, and a variation inhibitor. The tentative target calculator calculates a tentative target value, which is a tentative target value for the first physical quantity, based on the control target value. The correction calculator calculates a correction value, which is added to the tentative target value, based on a first measured value outputted from the first sensor and a second measured value outputted from the second sensor. The first target value calculator calculates as the first target value a value obtained by adding the correction value to the tentative target value. The failure discriminator discriminates whether a failure has occurred in the second sensor. The variation inhibitor inhibits the first target value to be designated from greatly varying due to the failure in the second sensor. When the failure discriminator discriminates that a failure has occurred in the second sensor, the first target value calculator designates the tentative target value as the first target value without adding the correction value to the tentative target value.

The above control apparatus includes at least two sensors (first sensor and second sensor). As long as both the first sensor and second sensor are normal, control of matching a control physical quantity with a control target value is performed based on measured values of the sensors.

A main controller performs control of matching a first physical quantity with a first target value. The first target quantity is a target quantity for the first physical quantity, and is designated by a target designator as a value for use in matching the control physical quantity with the control target value. When the main controller performs control of matching the first physical quantity with the first target value, the control physical quantity is therefore matched with the control target value.

The target designator designates the first target value by adding a correction value to a tentative target value. The tentative target value is a tentative target value for the first physical quantity, and is calculated based on the control target value without reference to a first measured value and second measured value. A tentative target calculator therefore always calculates the tentative target value irrespective of whether the first sensor and second sensor are working normally. In contrast, the correction value is calculated based on the second measured value. After the second sensor fails, the correction value is not therefore correctly calculated.

If the second sensor is determined to have failed, the correction value is not added to the tentative target value, and the tentative target value is designated as the first target value as it is. Accordingly, even after a normal measured value cannot be obtained from the second sensor, almost normal control can be continued by employing the tentative target value.

Suppose a time immediately after a failure occurs in the second sensor and before the tentative target value is designated as the first target value as it is. At such a time, an abnormal correction value may be calculated based on an abnormal value outputted from the second sensor, designating the abnormal first target value. That is, the first target value may greatly vary immediately after the second sensor fails, making control tentatively abnormal.

The target designator of the above control apparatus thus further includes a variation inhibitor. The variation inhibitor, which inhibits the first target value from greatly varying, diminishes an adverse effect attributable to a failure in the second sensor. The failure in the second sensor may fail to make control tentatively abnormal.

The control apparatus according to the example can thus sustain normal control even after the second sensor fails, and, in addition, suppress a tentative abnormality in control which occurs immediately after the second sensor fails. The first sensor alone therefore needs to include redundant sensors, but the second sensor needs not to include redundant sensors.

The present disclosure provides a control apparatus that can sustain normal control even if a sensor that does not include redundant sensors fails.

BRIEF DESCRIPTION OF DRAWINGS

The above and other objects, features, and advantages of the present disclosure will become more apparent from the following detailed description made with reference to the accompanying drawings. In the drawings.

DETAILED DESCRIPTION

Figure 1:
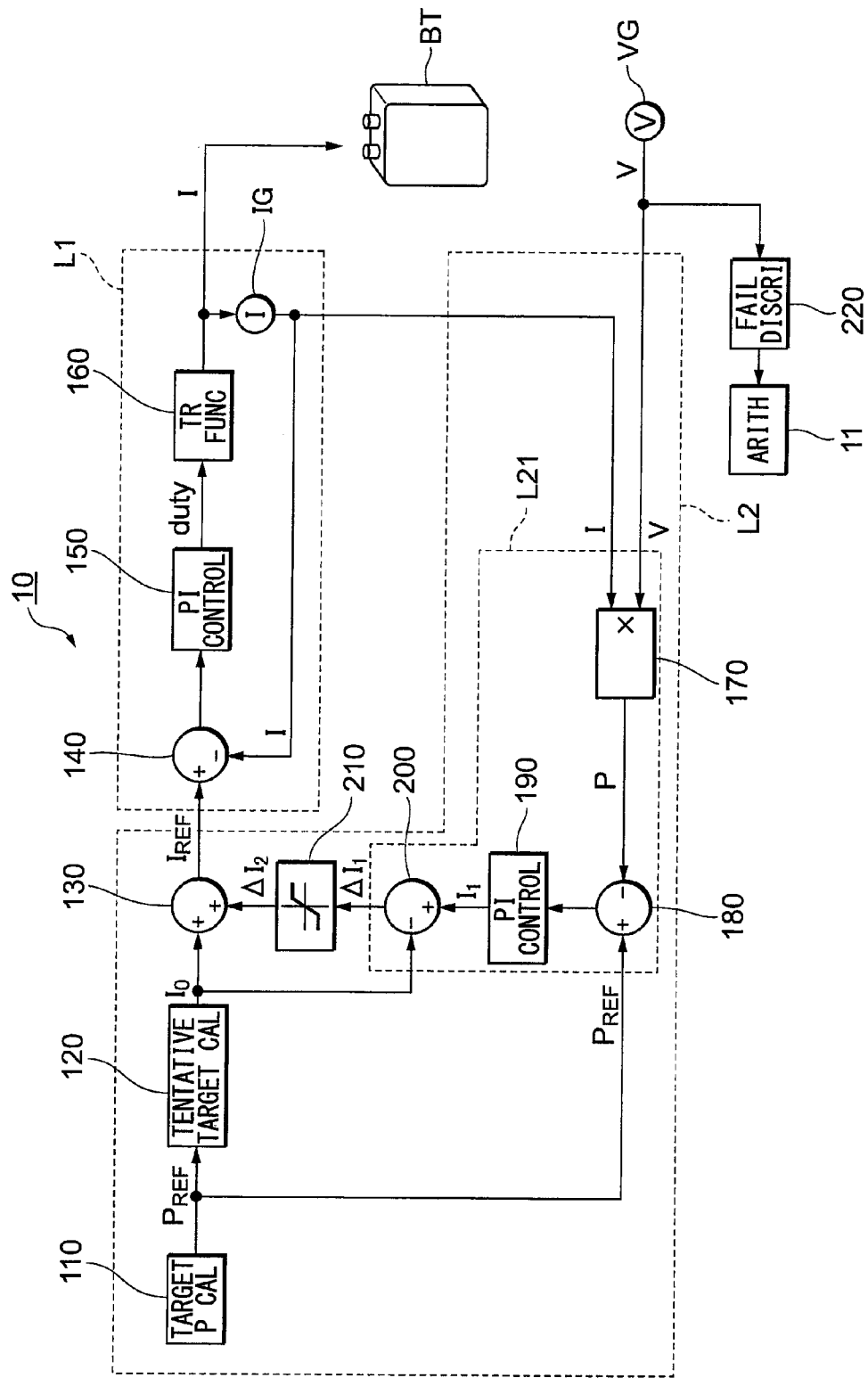
FIG. 1 is a block diagram illustrating an overall configuration of a control apparatus according to an embodiment of the present disclosure.

Referring to the appended drawings, an embodiment of the present disclosure will be described below. For a better understanding of a description, identical reference signs will be assigned to identical components in the drawings to the greatest possible extent. An iterative description will be omitted.

Referring to FIG. 1, a configuration of a control apparatus 10 according to an embodiment of the present disclosure will be described below. The control apparatus 10 performs control of matching a value of power, by which a battery unit BT is charged or discharged, with a designated target value. The configuration is a mere example, and the usage of the present disclosure is not limited to the foregoing one. The present disclosure can be applied to any control apparatus as long as the control apparatus performs feedback control using values measured by a plurality of sensors.

The battery unit BT includes an inverter (unshown). For charging the battery unit BT, after alternating-current (ac) power which is fed from an electric power system is converted into direct-current (dc) power by the inverter, the dc power has its voltage converted into another and is then fed to the battery unit BT. For discharging the battery unit BT, after the dc power outputted from the battery unit BT has its voltage converted into another by the inverter, the dc power is converted into ac power and then outputted to an outside source (load or electric power system). The control apparatus 10 controls the action of the inverter so as to match the value of power, by which the battery unit BT is charged or discharged, with a target value.

FIG. 1 is a block diagram illustrating a control system responsible for control performed by the control apparatus 10. Elements in FIG. 1 include not only components of the apparatus but also functional control blocks. In addition, FIG. 1 shows elements other than the control apparatus 10 (e.g., a transfer function 160 ("TR FUNC" in FIG. 1)).

The control system in FIG. 1 performs control of matching a value of power, which is fed to the battery unit BT (hereinafter, may be referred to as a power P), with a power target value PREF. The power to be fed to the battery unit BT shall include not only power, by which the battery unit BT is charged, but also power by which the battery unit BT is discharged (a negative value in this case). Herein, the value of power may be referred to as a control physical quantity; the power target value PREF may be referred to as a control target value.

The control apparatus 10 includes a main controller L1 and a target current designator L2. The main controller L1 is a control system that performs control of matching a value of a current (hereinafter, may be referred to as a current I), which is fed to the battery unit BT, with a current target value IREF. The target current designator L2, which is also referred to a target designator, is a control system that calculates the current target value IREF, which is used as the target value by the main controller L1, so that the power P can be matched with the power target value PREF. Herein, the value of current may be referred to as a first physical quantity; the current target value IREF may be referred to as a first target value.

The above control system in FIG. 1 is formed by combining the main controller L1, which is a minor loop, with the target current designator L2 which is a major loop, and is configured as a cascaded control system as a whole.

First, the main controller L1 will be described below. The main controller L1 includes an adder 140 and PI controller 150 ("PI CONTROL" in FIG. 1).

The adder 140 receives the current target value IREF from the target current designator L2, and the current I, which is fed to the battery unit BT from the inverter. The current I is a value measured by a current sensor IG included in the battery unit BT. The adder 140 subtracts the current I from the current target value IREF, to calculate a deviation from the current I. The calculated deviation is inputted to the PI controller 150. Herein, the current sensor IG may be referred to as a first sensor that measures the value of current as the first physical quantity.

The PI controller 150 produces a control signal, which is sent to the inverter included in the battery unit BT, based on the inputted deviation, and outputs the control signal. The PI controller 150 includes a gain and integrator (none shown). The PI controller 150 uses the gain and integrator to calculate a duty cycle of the control signal which is necessary to make the inputted deviation nil (match the current I with the current target value IREF).

The control signal, which has a rectangular wave, is used to control the opening/closing action of a switching element included in the inverter. The duty cycle is a ratio of a high-level time to a low-level time in the rectangular wave.

The transfer function 160 in FIG. 1 represents the relationship between (i) the duty cycle of the control signal, which is inputted to the inverter, and (ii) the resultant current I to be fed to the battery unit BT. A switching action of the inverter is performed according to the duty cycle of the control signal outputted from the PI controller 150; thereby, the current I to be fed to the battery unit BT is matched with the current target value IREF. As mentioned, the current I, which is also fed to the battery unit BT, is measured by the current sensor IG and inputted to the adder 140. That is, the current I is fed back.

The control apparatus 10 includes a plurality of identical current sensors IG, though FIG. 1 does not illustrate. That is, the current sensor IG includes redundant sensors. Even if one of the current sensors IG fails, a measured value of any other current sensor IG is selected (by majority vote) and fed back. Therefore, even if the current sensor IG fails, control to be executed by the main controller L1 remains unsusceptible. Normal control is eventually continued.

Next, the target current designator L2 will be described below. The target current designator L2 includes a target power calculator 110 ("TARGET P CAL" in FIG. 1), tentative target current calculator 120 ("TENTATIVE TARGET CAL" in FIG. 1), and adder 130. The other elements included in the target current designator L2 will be described later.

The target power calculator 110 designates and outputs the power target value PREF. In the present embodiment, the power target value PREF is designated by an external control apparatus other than the control apparatus 10, and inputted to the target power calculator 110. The target power calculator 110 designates the inputted value as the power target value PREF without any change, and outputs the power target value to the tentative target current calculator 120.

Alternatively, the target power calculator 110 may be designed to calculate the power target value PREF.

The tentative target current calculator 120, which is also referred to as a tentative target calculator, is an arithmetic unit that calculates a tentative target value I0 which is a tentative target value for the current I. The tentative target value I0 is calculated according to a formula (1) below.

$$I0=PREF/VN \quad (1)$$

Herein, VN denotes a nominal voltage of the battery unit BT (a value of which, hereinafter, may be referred to as a nominal voltage VN). The tentative target value I0 is calculated by dividing the power target value PREF by the nominal voltage VN. Herein, the value of voltage may be referred to as a second physical quantity. If the battery unit BT is operating normally, the value of a voltage across the terminals of the battery unit BT (hereinafter, may be referred to as a voltage V) is nearly approximate to the nominal voltage VN. Therefore, the tentative target value I0 calculated according to the formula (1) may be quite close to the target value (current target value IREF) that should be inputted to the main controller L1.

The adder 130, which is also referred to as a first target value calculator, calculates the current target value IREF as the first target value, by adding a correction value ΔI2 to the tentative target value JO calculated above. The calculated current target value IREF is inputted from the adder 130 to the main controller L1 (adder 140). The correction value ΔI2 is added to the tentative target value I0 in order to alleviate an adverse effect attributable to the difference found between the nominal voltage VN and voltage V.

The following explains a configuration for calculating the correction value ΔI2. The target current designator L2 further includes a multiplier 170, adder 180, PI controller 190 ("PI CONTROL" in FIG. 1), adder 200, and limiter 210.

The current I and voltage V are inputted to the multiplier 170. While the current I is a value measured by the current sensor IG, the voltage V is the value of the voltage across the terminals measured by a voltage sensor VG included in the battery unit BT. Herein, the voltage sensor VG may be referred to as a second sensor that measures the value of voltage as the second physical quantity. The multiplier 170 calculates the power P by multiplying the current I by the voltage V. The power P is a value of power actually fed to the battery unit BT. The calculated power P is inputted from the multiplier 170 to the adder 180.

The adder 180 receives the power P from the multiplier 170 and the power target value PREF from the target power calculator 110. The adder 180 subtracts the power P from the power target value PREF so as to calculate a deviation from the power P. The calculated deviation is inputted to the PI controller 190.

The PI controller 190 includes a gain and integrator (none unshown). The PI controller 190 uses the gain and integrator to calculate and output a value of a current (hereinafter, may be referred to as a current I1) which should be fed to the battery unit BT in order to make the inputted deviation nil (match the power P with the power target value PREF). The calculated current I1 is inputted from the PI controller 190 to the adder 200.

The adder 200 receives the current I1 from the PI controller 190 and the tentative target value I0 from the tentative target current calculator 120. The adder 200 subtracts the tentative target value I0 from the current I1 so as to calculate a correction value ΔI1. The calculated correction value ΔI1 may be a value added to the tentative target value I0 in order to make the difference between the power target value PREF and power P nil. Namely, the correction value ΔI1 may be used as the correction value ΔI2 as it is. Of the target current designator L2, the multiplier 170, adder 180, PI controller 190, and adder 200 will be collectively referred to as a correction calculator L21.

In the present embodiment, the correction value ΔI1 is not used as the correction value ΔI2 as it is, but the correction value ΔI1 is transformed using the limiter 210. A value resulting from the transformation is used as the correction value ΔI2.

The limiter 210, which may be also referred to as a variation inhibitor, is interposed between the adder 200 and adder 130. The correction value ΔI1 is inputted from the adder 200 to the limiter 210. A threshold α is preliminarily set in the limiter 210. If the absolute value of the correction value ΔI1 inputted to the limiter 210 is equal to or smaller than the threshold α, the correction value ΔI1 is outputted as the correction value ΔI2 as it is, and then inputted to the adder 130. If the absolute value of the correction value ΔI1 inputted to the limiter 210 exceeds the threshold α, the value of the threshold α (whose sign is identical to that of the correction value ΔI1) is outputted as the correction value ΔI2, and then inputted to the adder 130.

As mentioned, the correction value ΔI2 inputted to the adder 130 is added to the tentative target value I0. A value resulting from the addition is inputted as the current target value IREF to the main controller L1 (adder 140).

The control system having the foregoing configuration permits the control apparatus 10 to perform control of matching the power P, which is fed to the battery unit BT, with the power target value PREF.

In the present embodiment, the current sensor IG includes redundant sensors but the voltage sensor VG does not include any redundant sensor. That is, only one voltage sensor VG is included. If the voltage sensor VG fails, a value largely different from the voltage across the terminals of the battery unit BT may be inputted to the multiplier 170. Such a control may cause the value of the calculated current target value IREF to become inadequate, undesirably feeding power largely different from the power target value PREF to the battery unit BT.

In the present embodiment, if the voltage sensor VG fails, the control apparatus 10 performs control different from the above control.

Figure 2:
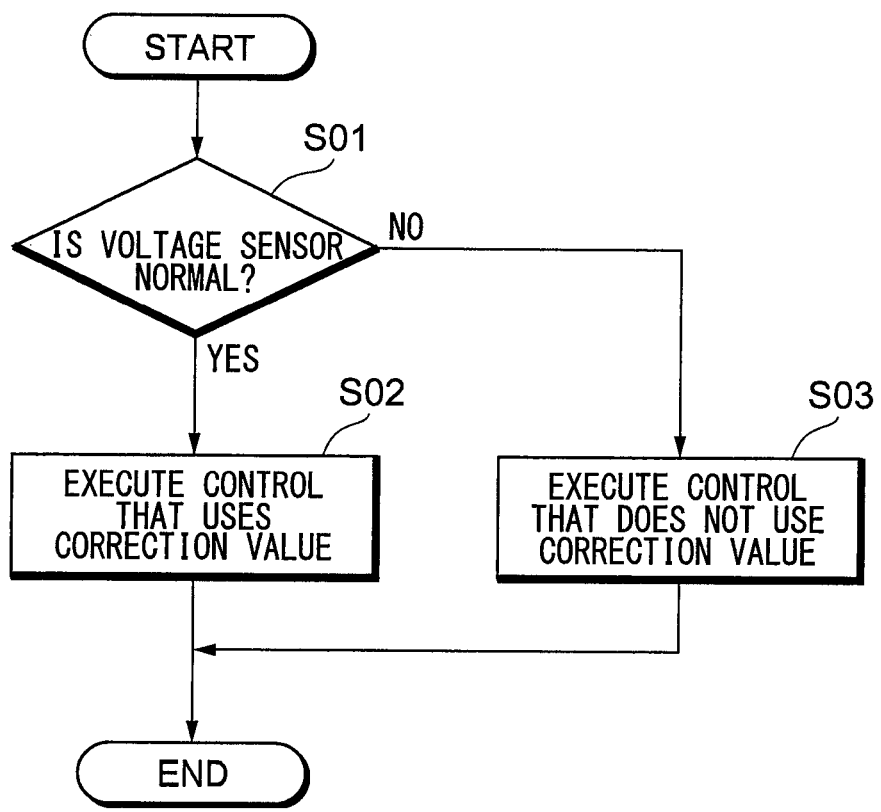
FIG. 2 is a flowchart illustrating processing executed by the control apparatus in FIG. 1.

FIG. 2 shows a flow of processing executed in the control apparatus 10. The processing is repeatedly executed at predetermined intervals by an arithmetic unit 11 (CPU) included in the control apparatus 10 (see "ARITH" in FIG. 1). The arithmetic unit 11 controls all actions in the control apparatus 10.

First, at S01, whether the voltage sensor VG works normally is decided based on a signal inputted from a failure discriminator 220 ("FAIL DISCRI" in FIG. 1). The failure discriminator 220 is one of functional control blocks included in the control apparatus 10, and always monitors a value outputted from the voltage sensor VG. If the value outputted from the voltage sensor VG exceeds a normal range or abruptly varies unusually, the failure discriminator 220 produces a signal (hereinafter, referred to as an abnormal signal) which signifies that a failure has occurred in the voltage sensor VG, and outputs the signal to the arithmetic unit 11.

If the abnormal signal is not inputted to the arithmetic unit 11, that is, if the voltage sensor VG is decided to work normally, the processing moves from S01 to S02. Thereafter, the aforesaid control is performed; namely, all the elements constituting the correction calculator L21 are brought into action, and control employing the correction value ΔI2 calculated based on a value measured by the voltage sensor VG is executed.

If the abnormal signal is inputted to the arithmetic unit 11, that is, if the voltage sensor VG is decided not to normally work, the processing moves from S01 to S03. At S03, the actions of all the elements constituting the correction calculator L21 are ceased.

At S03 and thereafter, the correction value ΔI2 is not therefore inputted to the adder 130. The adder 130 thus outputs the tentative target value I0, which is inputted from the tentative target current calculator 120, as the current target value IREF to the adder 140 without any change.

The tentative target value I0 is not a target value calculated based on a value measured by the voltage sensor VG but is a tentative target value calculated based on the nominal voltage VN. This may cause the power P to be finally fed to the battery unit BT to differ from the designated power target value PREF.

However, as mentioned, the voltage across the terminals of the battery unit BT is normally nearly identical to the nominal voltage VN, and the difference between the voltage across the terminals and the nominal voltage is small. The power P will not therefore greatly differ from the power target value PREF. Even after the voltage sensor VG fails, almost normal control may be performed.

However, during a period (transient period) from the time when a failure occurs in the voltage sensor VG to the time when all the elements constituting the correction calculator L21 cease their actions, an abnormal value outputted from the voltage sensor VG may be inputted to the correction calculator L21, and the abnormal correction value ΔI1 may be calculated based on the abnormal value.

However, the correction value ΔI1 is not inputted to the adder 130 as it is, but is inputted to the adder 130 after being transformed into the correction value ΔI2 by the limiter 210. Even if the absolute value of the correction value ΔI1 gets too large because of an abnormal value sent from the voltage sensor VG, the absolute value of the correction value ΔI2 will not get too large. This prevents control by the control apparatus 10 from becoming unstable even during a transient period from the time when a failure occurs in the voltage sensor VG to the time when all the elements constituting the correction calculator L21 cease their actions.

The threshold α preliminarily set in the limiter 210 is desirably designated in consideration of a width of a variation in the voltage across the terminals occurring when the battery unit BT is operating normally. Specifically, the threshold α is desirably set to a value a bit larger than the correction value ΔI1 to be calculated when the voltage across the terminals most greatly differs from the nominal voltage VN. As long as the threshold α is thus designated, the correction value ΔI1 is prevented from being changed by the limiter 210 although the voltage sensor VG does not fail.

The limiter 210 may be disposed at any other position in order to prevent an abnormality from occurring during a transient period immediately succeeding a failure in the voltage sensor VG. Suppose that the limiter 210 is interposed between the multiplier 170 and adder 180 to confine the value of the power P inputted to the adder 180 to a predetermined range.

However, such a case causes the power P inputted from the multiplier 170 to the limiter 210 to vary within a relatively wide range even when the voltage sensor VG is normal. For example, when the state charging the battery unit BT transitions to the state discharging the battery unit BT, the power P greatly varies from a positive value to a negative value.

Since the variation in the power P is not derived from an abnormality, the value of the power P should not be changed by the limiter 210. The threshold α in the limiter 210 thus has to be set to a value larger than the width of a variation in the power P (in a normal state). This, however, needs to designate the threshold α to be too large, hardly inhibiting the variation (the variation in the power P) occurring immediately after the voltage sensor VG fails.

In contrast, in the present embodiment, the limiter 210 is located at a position where to inhibit the variation in the correction value ΔI1. The correction value ΔI1 is added to the tentative target value I0, requiring the correction value ΔI1 to be a relatively small value and the variation width of the correction value ΔI1 to be normally small. The threshold α to be set in the limiter 210 is therefore designated to be so small as to reliably suppress an adverse effect occurring immediately after the voltage sensor VG fails. Nevertheless, the correction value ΔI1 may be designated not to exceed the threshold α in a normal state.

The above control apparatus 10 according to the present embodiment performs control of matching the power P, which is fed to the battery unit BT, with the designated power target value PREF. By the way, the battery unit BT uses typically, as an object of control performed with its internal control circuit, a value of a current to be fed, instead of a value of power to be fed. From this viewpoint, a target value to be designated in the control apparatus 10 is thought to be the target value of the current rather than the target value of the power (power target value PREF).

However, with the senses of a human being who uses the control apparatus 10 or battery unit BT, designating a target value for power can be more readily understood than designating a target value for a current.

The main controller L1 of the control system included in the control apparatus 10 is a part that performs control which is relatively hardly understood with the senses of a human being, that is, control of matching the current I, which is fed to the battery unit BT, with the designated current target value IREF. In contrast, the target current designator L2 may be a part that produces the current target value IREF using the power target value PREF and passes the current target value IREF to the main controller L1 so that the control can be relatively readily understood with the senses of a human being.

Assuming that the roles of the main controller L1 and target current designator L2 in FIG. 1 are defined as above, the control apparatus 10 may be designed so that if a failure occurs in the voltage sensor VG, the control apparatus can continue control to be performed by the main controller L1 (control that should be ensured at minimum) but will cease part of control intended to make the control relatively understandable with the senses of a human being (control that is not always necessary). In other words, a sensor that is supposed to include redundant sensors is appropriately selected so that if a failure occurs in the voltage sensor VG, while a minimum feature is ensured, only part of control that takes account of the senses of a human being will be sacrificed.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A control apparatus that performs control of matching a control physical quantity, which is an object of control, with a designated control target value, comprising:
    a first sensor that measures a first physical quantity;
    a second sensor that measures a second physical quantity;
    a target designator that designates a first target value, which is a target value for the first physical quantity, to match the control physical quantity with the control target value; and
    a main controller that performs control of matching the first physical quantity with the first target value, wherein:
    the target designator includes
        a tentative target calculator that calculates a tentative target value, which is a tentative target value for the first physical quantity, based on the control target value,
        a correction calculator that calculates a correction value, which is added to the tentative target value, based on a first measured value outputted from the first sensor and a second measured value outputted from the second sensor,
        a first target value calculator that calculates as the first target value a value obtained by adding the correction value to the tentative target value,
        a failure discriminator that discriminates whether a failure has occurred in the second sensor, and
        a variation inhibitor that inhibits the first target value to be designated from greatly varying due to the failure in the second sensor; and
    when the failure discriminator discriminates that a failure has occurred in the second sensor, the first target value calculator designates the tentative target value as the first target value without adding the correction value to the tentative target value.

2. The control apparatus according to claim 1, wherein the variation inhibitor adjusts in advance the correction value, which is to be added to the tentative target value, to confine the correction value to a predetermined range.

3. The control apparatus according to claim 1, wherein:
    each of (i) the control physical quantity, (ii) the first physical quantity, and (iii) the second physical quantity is of a battery unit;
    the first sensor is a current sensor that measures a value of current as the first physical quantity, whereas
    the second sensor is a voltage sensor that measures a value of voltage as the second physical quantity; and
    each of (i) the first target value and (ii) the tentative target value is of the value of current as the first physical quantity, whereas
    each of (i) the control physical quantity and (ii) the control target value is of a value of power.

* * * * *